(12) United States Patent
Iida et al.

(10) Patent No.: US 8,921,900 B2
(45) Date of Patent: Dec. 30, 2014

(54) SOLID-STATE IMAGING DEVICE AND CAMERA

(71) Applicant: Canon Kabushiki Kaisha, Tokyo (JP)

(72) Inventors: Satoko Iida, Yokohama (JP); Ginjiro Toyoguchi, Tokyo (JP); Shin Kikuchi, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 11 days.

(21) Appl. No.: 13/917,892

(22) Filed: Jun. 14, 2013

(65) Prior Publication Data

US 2013/0341683 A1    Dec. 26, 2013

(30) Foreign Application Priority Data

Jun. 20, 2012    (JP) ................... 2012-139162

(51) Int. Cl.
*H01L 31/0352*    (2006.01)
*H01L 31/02*    (2006.01)
*H01L 27/146*    (2006.01)

(52) U.S. Cl.
CPC .......... *H01L 31/02* (2013.01); *H01L 31/02019* (2013.01); *H01L 27/146* (2013.01)
USPC ........................... 257/225; 257/292; 257/465

(58) Field of Classification Search
CPC ................................................ H01L 27/14607
See application file for complete search history.

(56) References Cited

U.S. PATENT DOCUMENTS

| | | | |
|---|---|---|---|
| 5,245,203 A | 9/1993 | Morishita et al. | 257/113 |
| 5,352,920 A | 10/1994 | Morishita et al. | 257/435 |
| 6,649,951 B2 | 11/2003 | Kozuka et al. | 257/292 |
| 7,138,671 B2* | 11/2006 | Hirai et al. | 257/222 |
| 7,321,110 B2 | 1/2008 | Okita et al. | 250/208.1 |
| 7,361,527 B2 | 4/2008 | Lim | 438/60 |
| 7,408,210 B2 | 8/2008 | Ogura et al. | 257/233 |
| 7,456,888 B2 | 11/2008 | Kikuchi | 348/308 |
| 7,460,162 B2 | 12/2008 | Koizumi et al. | 348/294 |
| 7,550,793 B2 | 6/2009 | Itano et al. | 257/239 |
| 7,554,591 B2 | 6/2009 | Kikuchi et al. | 348/308 |
| 7,812,382 B2 | 10/2010 | Iida | 257/292 |
| 7,825,393 B2 | 11/2010 | Corby, Jr. et al. | 250/582 |
| 7,880,259 B2* | 2/2011 | Kaida | 257/465 |
| 7,907,196 B2 | 3/2011 | Ogura et al. | 348/308 |
| 7,978,241 B2 | 7/2011 | Koizumi et al. | 348/294 |
| 8,045,034 B2 | 10/2011 | Shibata et al. | 348/308 |
| 8,063,958 B2 | 11/2011 | Okita et al. | 348/241 |
| 8,110,859 B2 | 2/2012 | Iida | 257/292 |

(Continued)

FOREIGN PATENT DOCUMENTS

| | | |
|---|---|---|
| JP | 62-73662 A | 4/1987 |
| JP | 10-50976 A | 2/1998 |

(Continued)

*Primary Examiner* — Stephen W Smoot

(74) *Attorney, Agent, or Firm* — Fitzpatrick, Cella, Harper & Scinto

(57) ABSTRACT

A solid-state imaging device includes a photoelectric conversion unit that has a charge accumulation region and is configured to accumulate a charge that is generated in accordance with incident light in the charge accumulation region, and a transfer unit configured to transfer the charge accumulated in the charge accumulation region from the charge accumulation region. A potential distribution having a plurality of steps is formed in the charge accumulation region, and the further away from the transfer unit a step of the plurality of steps is, the greater the magnitude of the step is.

8 Claims, 5 Drawing Sheets

(56) References Cited

U.S. PATENT DOCUMENTS

| | | | |
|---|---|---|---|
| 8,110,885 B2 | 2/2012 | Iida et al. | 257/437 |
| 8,164,668 B2 | 4/2012 | Iida et al. | 348/308 |
| 8,174,600 B2 | 5/2012 | Ogura et al. | 348/301 |
| 8,174,604 B2 | 5/2012 | Shibata et al. | 348/308 |
| 8,379,124 B2 | 2/2013 | Kikuchi | 348/300 |
| 8,390,708 B2 | 3/2013 | Koizumi et al. | 348/294 |
| 8,400,541 B2 * | 3/2013 | Yamashita | 348/296 |
| 8,400,546 B2 | 3/2013 | Itano et al. | 348/308 |
| 8,441,558 B2 | 5/2013 | Okita et al. | 348/241 |
| 8,507,870 B2 | 8/2013 | Arishima et al. | 250/370.08 |
| 8,530,989 B2 | 9/2013 | Kikuchi et al. | 257/429 |
| 2008/0197389 A1* | 8/2008 | Park et al. | 257/292 |
| 2010/0231767 A1 | 9/2010 | Kikuchi | 348/301 |
| 2012/0007203 A1 | 1/2012 | Kono et al. | 257/435 |
| 2012/0008029 A1 | 1/2012 | Matsuda et al. | 348/300 |
| 2012/0008030 A1 | 1/2012 | Kono et al. | 348/301 |
| 2012/0008031 A1 | 1/2012 | Yamashita et al. | 348/302 |
| 2012/0008177 A1 | 1/2012 | Fujimura et al. | 358/482 |
| 2012/0168609 A1* | 7/2012 | Krymski | 250/208.1 |
| 2013/0014038 A1 | 1/2013 | Kim et al. | 715/760 |
| 2013/0119235 A1 | 5/2013 | Iida | 250/208.1 |
| 2013/0140435 A1 | 6/2013 | Kikuchi | 250/208.1 |
| 2013/0140665 A1 | 6/2013 | Koizumi et al. | 257/443 |
| 2013/0208172 A1 | 8/2013 | Tashiro et al. | 348/340 |
| 2013/0222659 A1 | 8/2013 | Okita et al. | 348/299 |

FOREIGN PATENT DOCUMENTS

| | | |
|---|---|---|
| JP | 2000-236081 A | 8/2000 |
| JP | 2000-312024 A | 11/2000 |
| JP | 2006-041538 A | 2/2006 |

* cited by examiner

SOLID-STATE IMAGING DEVICE AND CAMERA

BACKGROUND

1. Field of the Disclosure

The present disclosure relates to a solid-state imaging device and a camera.

2. Description of the Related Art

Solid-state imaging devices are used for various applications. In single-lens reflex cameras and astronomical telescopes, solid-state imaging devices with a photoelectric conversion unit that has a large area are used. Japanese Patent Laid-Open No. 2000-236081 proposes technology for forming a potential gradient at each point in a charge accumulation region of a photoelectric conversion unit so that a charge generated in the photoelectric conversion unit is rapidly and completely transferred to a transfer electrode by electric field drift.

SUMMARY

An aspect of the present disclosure provides a solid-state imaging device comprising: a photoelectric conversion unit including a charge accumulation region in which a charge generated in accordance with incident light is accumulated; and a transfer unit configured to transfer a charge accumulated in the charge accumulation region from the charge accumulation region, wherein a potential distribution having a plurality of steps is formed in the charge accumulation region, and the further away from the transfer unit a step of the plurality of steps is, the greater the magnitude of the step is.

Further features of the present disclosure will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the embodiments.

DESCRIPTION OF THE EMBODIMENTS

Figure 1:
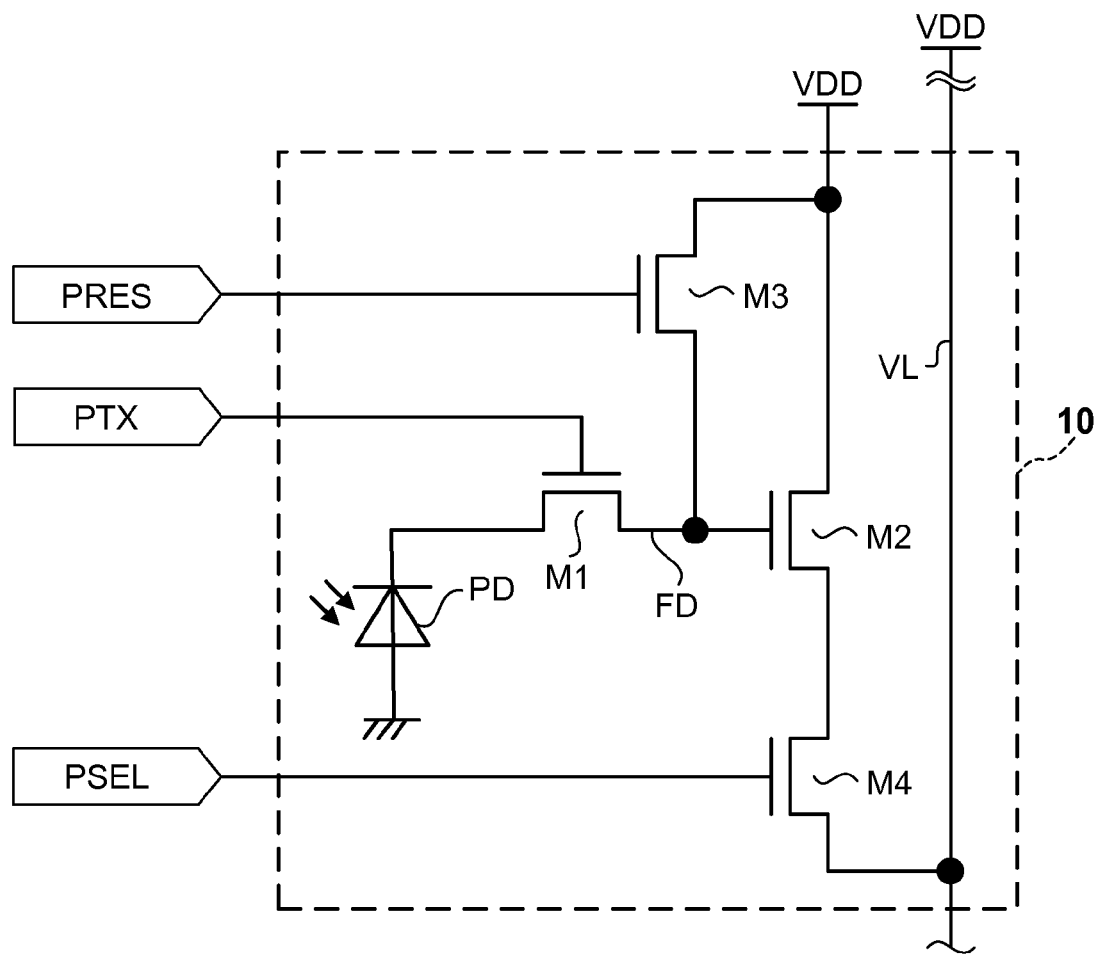
FIG. 1 is a diagram for explaining an example of the circuit configuration of a pixel of a solid-state imaging device according to an embodiment of the invention.

Solid-state imaging devices of some embodiments according to the invention are required not only to efficiently transfer charges but also to have high sensitivity and a high saturated charge quantity (i.e., high dynamic range). As will be described in detail below, although the technology disclosed in Japanese Patent Laid-Open No. 2000-236081 realizes an improvement in the transfer efficiency, sufficient performance with respect to the sensitivity and the saturated charge quantity cannot be exhibited. Thus, some embodiments of the invention provide a technology for improving the sensitivity and the saturated charge quantity while maintaining the transfer efficiency.

Embodiments of the invention will be described below with reference to the accompanying drawings. In the drawings, similar or the same elements are denoted by the same reference numerals, and redundant descriptions thereof will be omitted. Moreover, the embodiments can be modified or combined as appropriate. Some embodiments of the invention are directed to a solid-state imaging device, and particularly directed to a solid-state imaging device that has large-area pixels.

FIG. 1 is a diagram for explaining an example of the circuit configuration of a pixel 10 included in a solid-state imaging device according to some embodiments of the invention. Elements that constitute the pixel 10 may be arranged on a semiconductor substrate. The area of the pixel 10 that is arranged on the semiconductor substrate may be, for example, 50 to 100000 $\mu m^2$, and particularly may be 100 to 1000 $\mu m^2$. In the example described below, the length of one side of the pixel 10 is about 20 $\mu m$. In this specification, the area of a certain region means the area of that region in a plane of the semiconductor substrate as seen from a direction of incident light. In other words, the area of a certain region means the area of a region that is formed by orthographically projecting the certain region onto a plane that is parallel to the principal surface of the semiconductor substrate. The solid-state imaging device may have a pixel array that is an array of a plurality of pixels 10. The pixels 10 may each include a photodiode PD and a plurality of MOS transistors M1 to M4. The photodiode PD functions as a photoelectric conversion unit that generates a charge in accordance with incident light. The photodiode PD is connected via the MOS transistor M1 to a floating diffusion FD. The MOS transistor M1 is controlled by a signal PTX so as to be switched between a conductive state and a non-conductive state. When the MOS transistor M1 is in the conductive state, the MOS transistor M1 transfers a charge that is generated in the photodiode PD to the floating diffusion FD. That is to say, the MOS transistor M1 functions as a transfer unit that transfers a charge from the photodiode PD. The floating diffusion FD converts the transferred charge to a voltage signal. That is to say, the floating diffusion FD functions as a signal conversion unit that converts a charge to an electric signal. The converted voltage signal is amplified by the MOS transistor M2, which operates as a source follower, and read out to a vertical signal line VL via the MOS transistor M4 whose conduction state is controlled by a signal PSEL. The potential of the floating diffusion FD is reset to a predetermined potential by the MOS transistor M3 whose conduction state is controlled by a signal PRES. That is to say, the MOS transistor M3 functions as a reset unit that resets the floating diffusion FD and the photodiode PD.

Figure 2A:
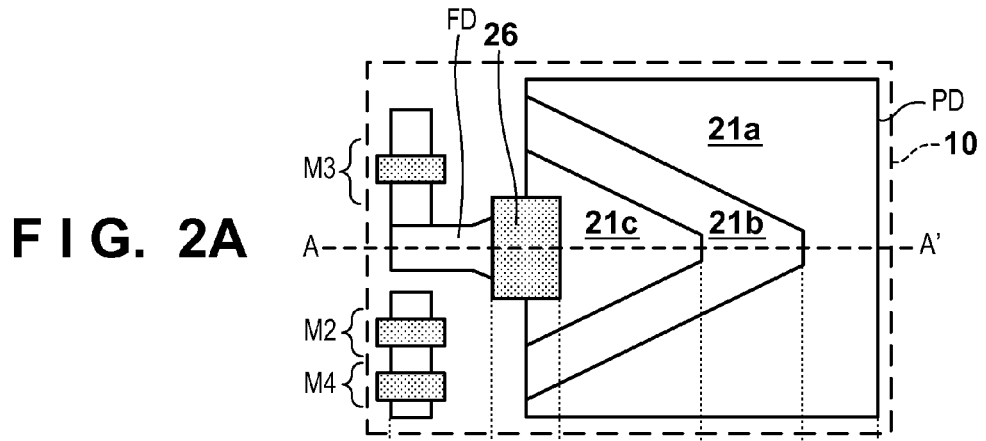
FIGS. 2A to 2C are diagrams for explaining an example of the structure of the pixel of the solid-state imaging device according to the embodiment of the invention.
Figure 2B:
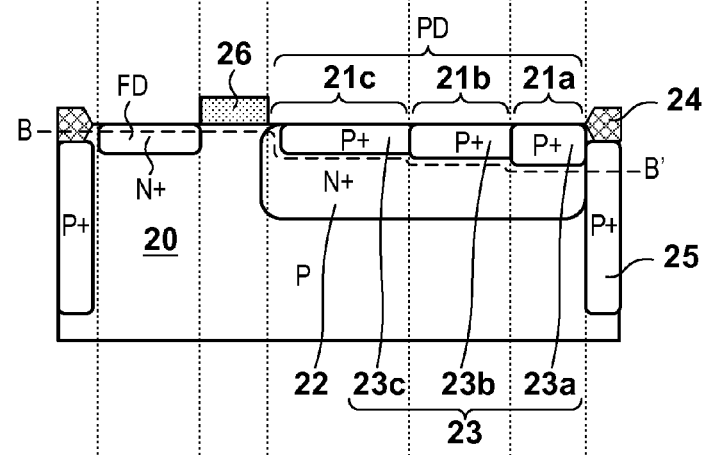
Figure 2C:
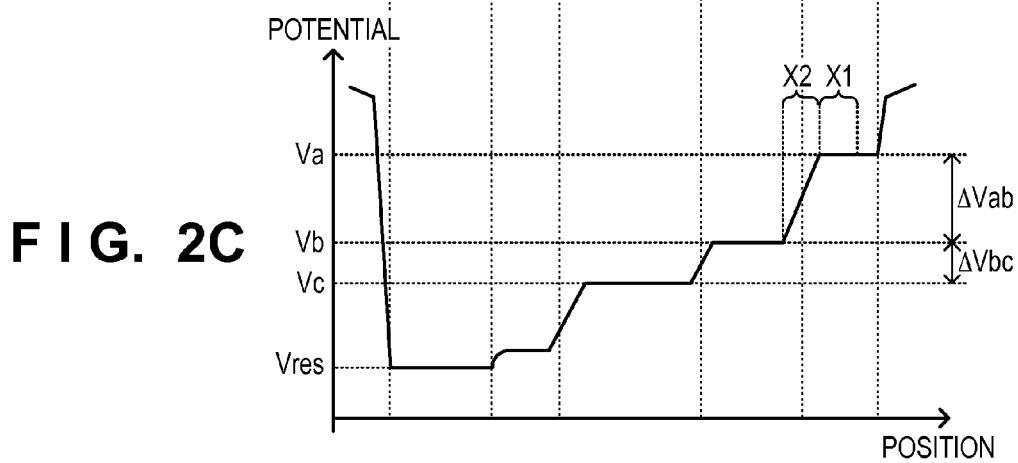

Next, an example of the configuration of the pixel 10 will be described with reference to the layout diagram and the cross-sectional view of FIGS. 2A to 2C. FIG. 2A is a plan view of the pixel 10 as seen from a direction of incidence, FIG. 2B is a cross-sectional view taken along line A-A' in FIG. 2A, and FIG. 2C shows a potential distribution along line B-B' in FIG. 2B. This potential distribution indicates a state that is formed in a case where the MOS transistor M1 is switched to the conductive state and the floating diffusion FD is reset to a reset voltage Vres.

In the example shown in FIGS. 2A and 2B, the photodiode PD is a buried photodiode that is formed in a P-type semiconductor substrate 20. Alternatively, the photodiode PD may be formed in a P-well region that is formed in an N-type semiconductor substrate. The photodiode PD includes an N+ charge accumulation region 22 and a P+ surface region 23 that is formed on the N+ charge accumulation region 22. A charge generated in the photodiode PD is accumulated in the charge accumulation region 22. In the example shown in FIGS. 2A and 2B, the length of one side of the photodiode PD is about 16 μm. The pixel 10 is surrounded by an element isolation region 24 (not shown in FIG. 2A) and is electrically isolated from other neighboring pixels. The perimeter of the photodiode PD may be defined by the element isolation region 24. Moreover, a P+ channel stop region 25 (not shown in FIG. 2A) may be formed beneath the element isolation region 24. A region between the photodiode PD and the N+ floating diffusion FD functions as a channel region of the MOS transistor M1 and is covered by a transfer electrode 26 of the MOS transistor M1. When the MOS transistor M1 is switched to the conductive state, a channel serving as a charge transfer path is formed in the channel region. Thus, a charge accumulated in the charge accumulation region 22 is transferred from the charge accumulation region 22 to the floating diffusion FD by control of the voltage of the transfer electrode 26.

The surface region 23 includes three semiconductor regions that have different impurity concentrations. The three semiconductor regions are respectively referred to as a surface region 23c, a surface region 23b, and a surface region 23a in order from the transfer electrode 26. In conformity with the shape of this surface region 23, the photodiode PD also is divided, or partitioned, into three regions 21a to 21c, and the charge accumulation region 22 is divided, or partitioned, into three partial regions as well. Due to the differences in impurity concentration of the surface region 23, the charge accumulation region 22 has different potentials in the different regions 21a to 21c. The further the position is away from the transfer electrode 26, the smaller the value of the potential of the charge accumulation region 22. The potential distribution has steps at positions corresponding to the boundaries between the regions 21a to 23c. Each step has a gradient in which the value of the potential becomes greater as the position comes closer to the transfer electrode 26. Thus, an electron at a position where the potential has a gradient moves toward the transfer electrode 26 due to electric field drift. The potential herein is the potential for a positive charge. When the potential of a certain region is small, it means that the potential energy of a positive charge placed in that region is small. In the present embodiment, electrons, which carry a negative charge, are dealt with as a charge to be converted to an electric signal. For this reason, FIG. 2C shows that the potential decreases toward the upper end of the vertical axis so as to help to intuitively understand the magnitude of the potential for electrons.

In the present embodiment, each region of the charge accumulation region 22 includes a portion in which the potential is flat, and the value of the potential in this flat portion is used as the value of the potential in that region. In other embodiments, the value of the potential in a central portion of each region of the photodiode PD or the average value of the potential in that region may also be used as the value of the potential in that region. As shown in FIG. 2C, the potential of the charge accumulation region 22 is Va in a portion contained in the region 21a, Vb in a portion contained in the region 21b, and Vc in a portion contained in the region 21c.

In the example shown in FIG. 2A, the boundary between the regions 21a and 21b defines an upper base and two oblique sides of a trapezoid. The length of the lower base (width in a direction that is parallel to the channel width of the MOS transistor M1) of this trapezoid is, for example, 14 μm, and the height (width in a direction that is orthogonal to the channel width of the MOS transistor M1) of this trapezoid is, for example, 12 μm. Similarly, the boundary between the regions 21b and 21c defines an upper base and two oblique sides of a trapezoid. The length of the lower base (width in the direction that is parallel to the channel width of the MOS transistor M1) of this trapezoid is, for example, 6 μm, and the height (width in the direction that is orthogonal to the channel width of the MOS transistor M1) is, for example, 4 μm.

A step of a potential distribution is the difference in potential value between two portions in each of which the potential distribution is flat. When the magnitude of that step of the potential distribution that is formed between the regions 21a and 21b is ΔVab, ΔVab=Vb−Va. When the magnitude of that step of the potential distribution that is formed between the regions 21b and 21c is ΔVbc, ΔVbc=Vc−Vb. In the solid-state imaging device of the present embodiment, the photodiode PD is formed such that a potential distribution that satisfies ΔVab>ΔVbc is formed. For example, when the reset voltage Vres is about 5 V, a potential distribution is formed in which ΔVab is 1.0 to 3.0 V and ΔVbc is 0.05 to 1.0 V. Moreover, the potential Va of the charge accumulation region 22 in the region 21a, which is situated furthest from the transfer electrode 26, may be set at about 0 V, or at −0.1 to −0.3 V. By reducing the value of Va, it is possible to maintain the sensitivity in this region 21a and increase ΔVab. In the solid-state imaging device according to the present embodiment, satisfying ΔVab>ΔVbc makes it possible to improve the transfer efficiency while improving the saturated charge quantity and the sensitivity, as will be described later.

Figure 3A:
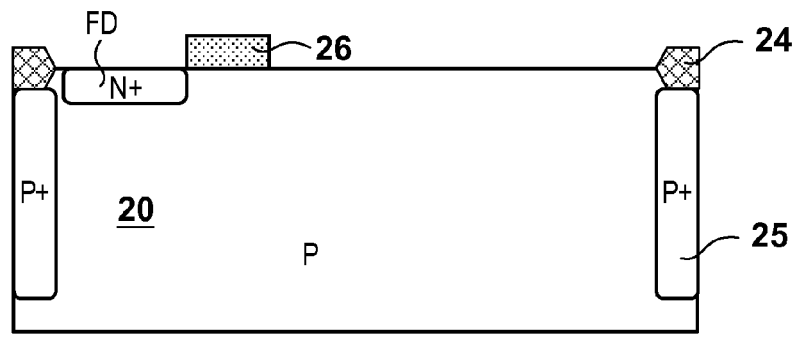
FIGS. 3A to 3E are diagrams for explaining an example of a method for manufacturing the pixel of the solid-state imaging device according to the embodiment of the invention.

Subsequently, an example of a method for manufacturing a solid-state imaging device that has the pixels 10 will be described using FIGS. 3A to 3E. First, as shown in FIG. 3A, the semiconductor substrate 20 in which the floating diffusion FD, the element isolation region 24, the channel stop region 25, and the transfer electrode 26 are formed is prepared. This step can be realized using an existing technique, and so a description thereof will be omitted.

Figure 3B:
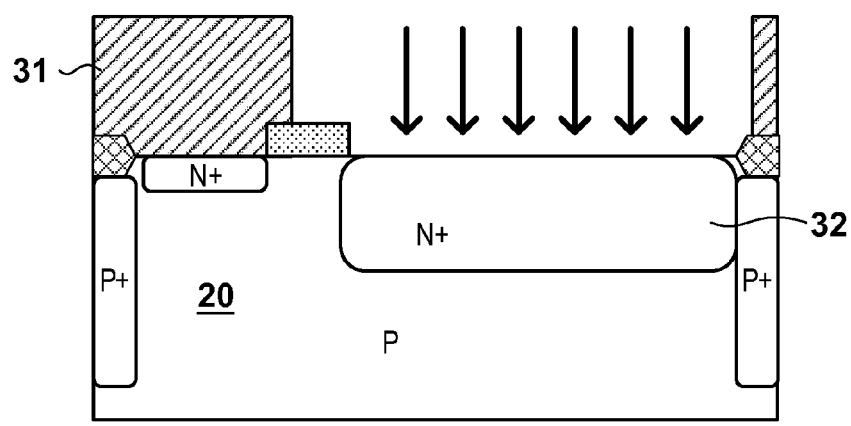

Next, as shown in FIG. 3B, a resist pattern 31 is formed, the resist pattern 31 exposing a portion of the transfer electrode 26 as well as a region in which the photodiode PD is formed, and covering the other portions. Then, arsenic ions are implanted into the semiconductor substrate 20 through the opening of this resist pattern 31 to form an N+ semiconductor region 32 with an impurity concentration of 1e17 cm$^{-3}$.

Figure 3C:
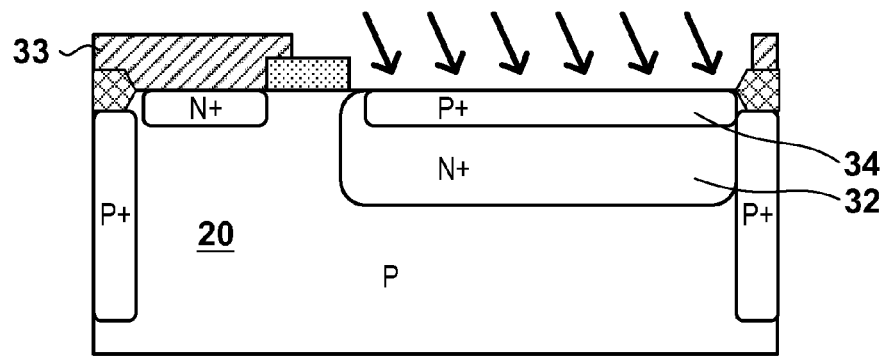

Next, as shown in FIG. 3C, after the resist pattern 31 is removed, a resist pattern 33 is formed, the resist pattern 33 exposing a portion of the transfer electrode 26 as well as the region in which the photodiode PD is formed, and covering the other portions. Then, boron ions are implanted into the semiconductor substrate 20 through the opening of this resist pattern 33 at an acceleration energy of 15 keV and an implantation angle of 25° to form a P+ semiconductor region 34 with an impurity concentration of 3e18 cm$^{-3}$. The implantation angle is set to such a direction that the boron ions implanted into the semiconductor substrate 20 advance in a direction away from the transfer electrode 26. Thus, an offset is provided between the channel of the MOS transistor M1 and the semiconductor region 34, and formation of a potential pocket on the charge transfer path can be prevented.

Figure 3D:
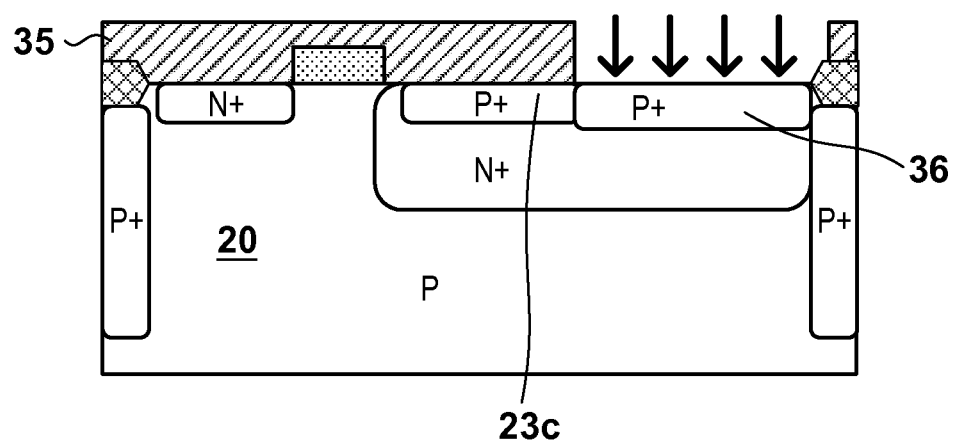

Next, as shown in FIG. 3D, after the resist pattern 33 is removed, a resist pattern 35 is formed, the resist pattern 35 exposing a region in which the regions 21a and 21b of the photodiode PD are formed, and covering the other portions including a region in which the region 21c of the photodiode PD is formed. Then, boron ions are implanted into the semiconductor substrate 20 through the opening of this resist pattern 35 at an acceleration energy of 15 keV and an implantation angle of 0° to form a P+ semiconductor region 36 with an impurity concentration of 5e18 cm$^{-3}$. At this time, a portion of the semiconductor region 34 into which the boron ions are not implanted serves as the surface region 23c of the photodiode PD.

Figure 3E:
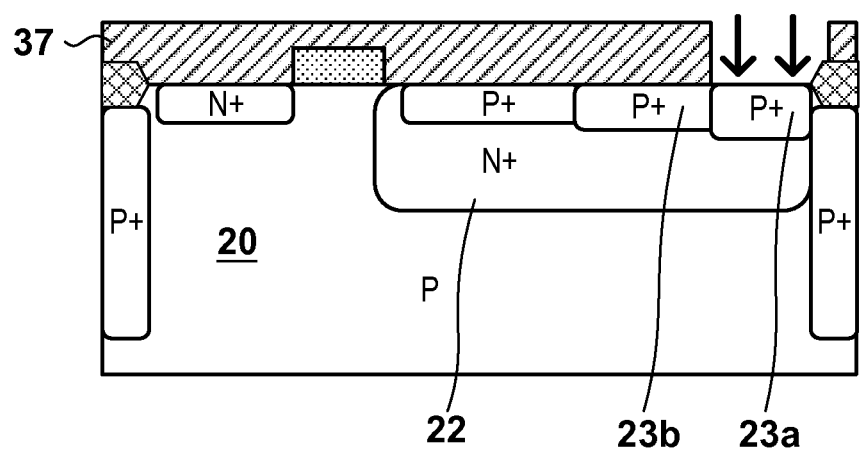

Finally, as shown in FIG. 3E, after the resist pattern 35 is removed, a resist pattern 37 is formed, the resist pattern 37 exposing a region in which the region 21a of the photodiode PD is formed, and covering the other portions including a region in which the regions 21b and 21c of the photodiode PD are formed. Then, boron ions are implanted into the semiconductor substrate 20 through the opening of this resist pattern 37 at an acceleration energy of 25 keV and an implantation angle of 0° to form the P+ surface region 23a with an impurity concentration of 1e19 cm$^{-3}$. At this time, a portion of the semiconductor region 36 into which the ions are not implanted serves as the surface region 23b of the photodiode PD. Moreover, the semiconductor region 32 excluding the surface regions 23a to 23c serves as the charge accumulation region 22. Thus, the difference in impurity concentration between the surface regions 23a and 23b is greater than the difference in impurity concentration between the surface regions 23b and 23c, and therefore a potential distribution that satisfies $\Delta Vab > \Delta Vbc$ is formed.

In the surface regions 23a and 23b, since the ions are implanted at an implantation angle of 0°, that is, orthogonally to the surface of the semiconductor substrate 20, the P+ semiconductor regions can be formed deep in the semiconductor region 32. Moreover, since the semiconductor region 32 and the semiconductor region 34 are formed using the transfer electrode 26 as a portion of the masks, alignment accuracy of the charge accumulation region 22 with the transfer electrode 26 and alignment accuracy of the surface region 23c with the transfer electrode 26 are improved. Moreover, since the boron ions for forming the surface region 23c are implanted also into the region in which the surface region 23b is formed, the surface region 23b and the surface region 23c can be continuously formed. The same also applies to the surface region 23a and the surface region 23b. As a result of manufacturing the solid-state imaging device in the above-described manner, variations in transfer characteristics among the pixels are reduced.

Adjusting the acceleration energy and the angle during implantation as described above makes it possible to form a photodiode PD such that a potential distribution that satisfies $\Delta Vab > \Delta Vbc$ is formed. Effects of formation of such a photodiode PD will be described below.

In the solid-state imaging device, before the start of an accumulating operation, the charge accumulation region 22 of the photodiode PD is completely depleted by a reset operation. In order for a charge that is generated in the photodiode PD to be transferred to the floating diffusion FD, it is required that $\Delta V$, which is defined below, be a positive value.

$$\Delta V = (Vres - Qsat/Cfd) - Vdep$$

Here, Vres represents the reset voltage, Qsat represents the saturated charge quantity of the photodiode PD, Cfd represents the capacitance of the floating diffusion FD, and Vdep represents the depleting voltage of the charge accumulation region 22. Moreover, in order for the charge to be rapidly and completely transferred without being trapped in a potential pocket, it is required that the charge transfer efficiency be increased by maximizing the value of $\Delta V$.

The reset voltage Vres and the capacitance Cfd in the above-described formula are often determined by the specifications of a product. Therefore, to increase $\Delta V$, the depleting voltage Vdep is reduced, or the saturated charge quantity Qsat is reduced. The depleting voltage Vdep is determined by the impurity concentration and the width of a depletion layer in the charge accumulation region 22. At a low impurity concentration of the charge accumulation region 22, the depletion layer is likely to widen, and as a result, the depleting voltage Vdep decreases. Moreover, the width of the depletion layer in the charge accumulation region 22 under predetermined bias conditions is determined by the impurity concentration of a semiconductor region that has a conductivity type that is opposite to the conductivity type of the charge accumulation region 22 and forms a PN junction with the charge accumulation region 22. The higher the impurity concentration of the semiconductor region of the opposite conductivity type, the wider the width of the depletion layer in the charge accumulation region 22. On the other hand, the saturated charge quantity Qsat is determined by the impurity concentration in the depletion layer. The higher the impurity concentration in the depletion layer, the greater the saturated charge quantity Qsat. Therefore, if the impurity concentration of the charge accumulation region 22 is reduced, the depleting voltage Vdep is reduced, but the saturated charge quantity Qsat also is reduced. Alternatively, in order to increase the saturated charge quantity Qsat, the impurity concentration of the charge accumulation region 22 is increased, and in order to compensate for the accordingly decreased likelihood of the depletion layer in the charge accumulation region 22 widening, the impurity concentration of the semiconductor region that has the opposite conductivity type to that of the charge accumulation region 22 and forms a PN junction with the charge accumulation region 22 is increased. In this manner, a large saturated charge quantity Qsat and a small depleting voltage Vdep are made mutually compatible. For example, although it is possible to increase the impurity concentration of the conductivity type of the charge accumulation region 22 while suppressing an increase in the width of the depletion layer by implanting ions of a conductivity type that is opposite to the conductivity type of the charge accumulation region 22 into a portion directly under the charge accumulation region 22, the ions implanted in this manner cause a barrier to charge collection at a deep position, resulting in a decrease in the sensitivity. Moreover, if ions of a conductivity type that is opposite to the conductivity type of the charge accumulation region 22 are implanted, the saturated charge quantity decreases. As described above, there is a trade-off relationship between improvement in the charge transfer efficiency and improvement in the saturated charge quantity.

A charge that is generated in a region of the photodiode PD that is near the transfer electrode 26 is influenced by a high electric field that is caused by a high reset voltage Vres of the floating diffusion FD during charge transfer, and is easily transferred. Accordingly, even if the potential of this region is large, this has only a slight influence on the transfer efficiency. A charge that is generated in a region of the photodiode PD that is away from the transfer electrode 26 is unlikely to be influenced by the high electric field that is caused by the high reset voltage Vres of the floating diffusion FD during charge transfer. Generally, transfer characteristics deteriorate exponentially with distance from the transfer electrode 26. For this reason, in order to efficiently move the charge that is generated in this region toward the transfer electrode 26, the potential is reduced even at the cost of the saturated charge quantity.

The inventors of the invention found that forming the photodiode PD such that the magnitudes of the steps of the potential in the charge accumulation region 22 satisfy $\Delta Vab > \Delta Vbc$ provides a good balance between improvement in the saturated charge quantity of the photodiode PD and improvement in the transfer efficiency. Specifically, in the regions 21b and 21c that are near the transfer electrode 26, the potential is increased to improve the saturated charge quantity, and in the region 21a that is away from the transfer electrode 26, the potential is reduced to improve the transfer efficiency and improve the sensitivity.

Unlike the configuration of the above-described embodiment, according to the configuration disclosed in Japanese Patent Laid-Open No. 2000-236081, the magnitudes of steps of the potential between different regions of the surface region that have different impurity concentrations are constant. This means that in the example shown in FIG. 2C, a potential distribution would be formed such that ΔVab=ΔVbc. For this reason, in a region that is near the transfer electrode, the saturated charge quantity cannot be sufficiently improved. Thus, the saturated charge quantity of the entire solid-state imaging device also is less than that of the embodiment of the invention. As a comparative example, the potential of the charge accumulation region 22 in the region 21b of the configuration shown in FIGS. 2A to 2C was set to (Va+Vc)/2, and an experiment was conducted in which the performance of the above-described embodiment of the invention was compared with the performance of this comparative example. The results of this experiment are shown below.

|  | Present embodiment | Comparative example |
|---|---|---|
| Number of saturated electrons | 350,000 | 150,000 |
| Transfer efficiency | 100% | 100% |
| Sensitivity | 530,000 electrons/lx · sec | 300,000 electrons/lx · sec |

As can be seen from this table, although both configurations achieve a transfer efficiency of 100%, the present embodiment is superior to the comparative example both in the amount of saturated electrons and in the sensitivity.

Moreover, according to the configuration disclosed in Japanese Patent Laid-Open No. 2000-236081, the photodiode is formed such that there is a potential gradient at every point in the charge accumulation region. Thus, the area of each of the regions of the surface region that have different impurity concentrations cannot be increased. If the area of any region is increased, a portion in which the potential is flat would be created. However, according to the configuration of the present embodiment, even if a portion in which the potential is flat is created in the charge accumulation region 22, a charge can be transferred with sufficient efficiency.

As described above, a charge that is generated in the regions 21b and 21c, which are situated near the transfer electrode 26, is easily transferred under the influence of a high electric field that is caused by the reset voltage Vres, and therefore the charge can be transferred with sufficient efficiency even if the potential in the charge accumulation region 22 is flat. Moreover, a charge that is generated in the region 21a, which is situated away from the transfer electrode 26, moves mainly by diffusion in a portion in which the potential is flat, and moves mainly by electric field drift due to the potential difference ΔVab at the boundary between the regions 21a and 21b. Thus, the time Tm it takes for a charge generated in the region 21a to move to the region 21b is expressed by a formula below.

$$Tm=(X1^2/\mu e) \times q/kT + X2^2/(\mu e \times \Delta Vab)$$

Here, as shown in FIG. 2C, X1 represents the distance from a position at which a charge is generated to a portion at which the flat potential starts sloping, and X2 represents the width of a portion at the boundary between the regions 21a and 21b, in which the potential slopes. Moreover, μe represents the mobility of electrons. Movement of a charge that conforms to this formula occurs even in an accumulation period for which the MOS transistor M1 for transferring a charge is in a non-conductive state. Thus, when the value of ΔVab is sufficiently increased, a charge that is generated in the region 21a can be moved to the region 21b before the start of a read-out period subsequent to the accumulation period. Therefore, the charge transfer efficiency can be improved, and complete transfer of the charge during the read-out period can be realized.

Figure 4A:
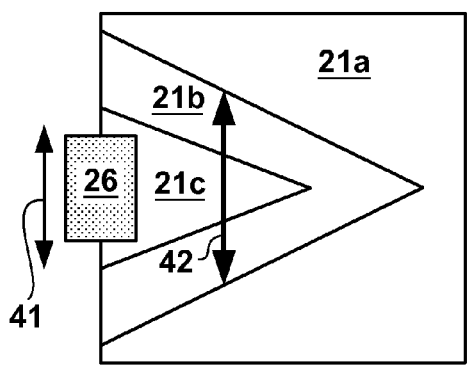
FIGS. 4A to 4F are diagrams for explaining variations of the pixel of the solid-state imaging device according to the embodiment of the invention.
Figure 4B:
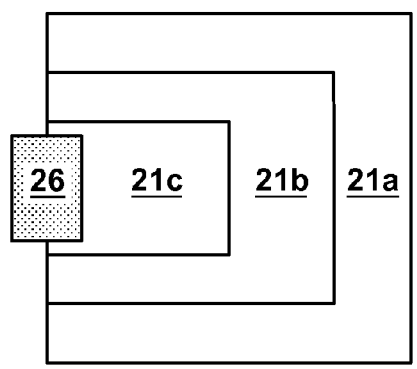
Figure 4C:
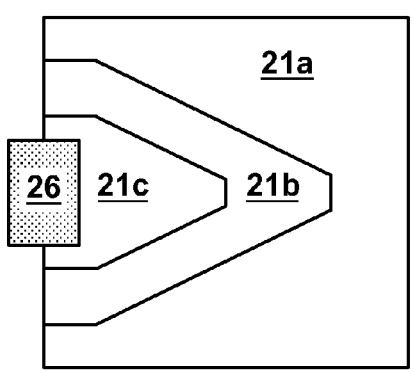
Figure 4D:
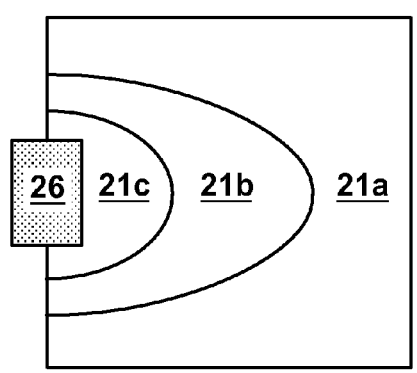
Figure 4E:
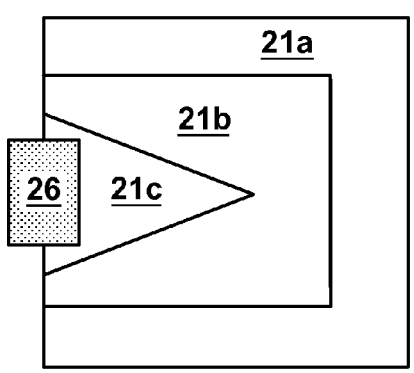

Then, variations of the shapes of the regions 21a, 21b, and 21c of the photodiode PD will be described using FIGS. 4A to 4F. As shown in FIGS. 4A to 4C, the shapes of the boundaries between the regions 21a, 21b, and 21c may also be triangular, rectangular, or polygonal with five or more sides. Moreover, as shown in FIG. 4D, the boundary between regions may also be curved, and as shown in FIG. 4E, the boundary between the regions 21a and 21b and the boundary between the regions 21b and 21c may also define mutually different shapes. In particular, as shown in FIGS. 4A, 4C, 4D, and 4E, when the shape of any region of the photodiode PD is set such that the width of that region in a width direction of the channel region decreases as the distance from the transfer electrode 26 increases, the charge transfer efficiency can be improved even more. For example, in FIG. 4A, a width 42 at a certain position of the region 21b in a direction parallel to a channel width direction 41 decreases as the distance from the transfer electrode 26 increases.

Figure 4F:
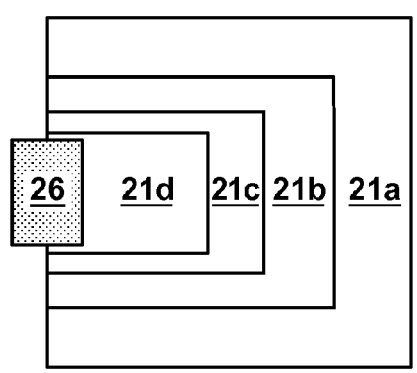

In the above-described examples, the photodiode PD was divided into three regions. However, as shown in FIG. 4F, the photodiode PD may also be divided into four regions 21a to 21d, or may also be divided into five or more regions. In FIG. 4F, when the difference between the potential of the charge accumulation region 22 in the region 21c and the potential of the charge accumulation region 22 in the region 21d is ΔVcd, ΔVcd<ΔVbc<ΔVab holds.

A configuration is also possible in which the areas of the regions 21a to 21c of the photodiode PD increase with distance from the transfer electrode 26. That is to say, the photodiode PD may also be formed such that (area of region 21a)>(area of region 21b)>(area of region 21c) is satisfied. In the present embodiment, since the magnitudes of the steps of the potential of the charge accumulation region 22 increase with distance from the transfer electrode 26, when the areas of the regions of the charge accumulation region 22 are set such that the further away from the transfer electrode 26 a region is, the larger the area of this region is, the charge transfer efficiency of this region improves.

In the above-described example, the impurity concentrations of the surface region 23 in the regions 21a to 21c of the photodiode PD were set by adjusting the dose. However, the impurity concentration may also be varied by adjusting the acceleration voltage for ion implantation or the number of times ion implantation is performed. Moreover, instead of adjusting the impurity concentration of the surface region 23, the potential distribution shown in FIG. 2C may also be realized by adjusting the impurity concentration distribution of the charge accumulation region 22. In this case, the difference in impurity concentration of the charge accumulation region 22 between the regions 21a and 21b is set to be greater than the difference in impurity concentration of the charge accumulation region 22 between the regions 21b and 21c. Furthermore, the potential distribution shown in FIG. 2C may also be realized by partially extending the channel stop region 25 into the photodiode PD. Moreover, in order to secure a saturated charge in the immediate vicinity of the transfer electrode 26, it is also possible that the surface regions 23b and 23c are formed so as to extend deep beneath the silicon surface and the surface region 23a is formed shallowly so that saturation in the surface regions 23b and 23c is secured. In the above-described embodiment, a buried photodiode was used as the photodiode PD. However, other photodiodes and phototransistors that function as the photoelectric conversion unit may also be used. Moreover, the invention can be carried out in the same manner even if the conductivity types of the semiconductor regions are interchanged. In the above-described embodiment, all of the regions 21a, 21b, and 21c have a flat portion in the potential distribution. However, it is also possible that some or all of these regions do not contain a flat portion. Moreover, the destination to which a charge in the charge accumulation region is transferred is not limited to the signal conversion unit, and may also be a charge discharge unit or a charge retaining unit.

Hereinafter, a camera in which the solid-state imaging device according to the above-described embodiments is incorporated will be described as an application of this solid-state imaging device for illustrative purposes only. The concept of the camera herein includes not only apparatuses that are primarily intended to perform shooting, but also apparatuses (for example, personal computers, portable terminals, and the like) that have the shooting function as an auxiliary function. The camera includes the solid-state imaging device according to the invention, which has been described in the above-described embodiments as an example, and a signal processing unit that processes signals output from this solid-state imaging device. This signal processing unit may include, for example, an A/D convertor and a processer that processes digital data output from this A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-139162, filed Jun. 20, 2012, which is hereby incorporated by reference herein in its entirety.

What is claimed is:

1. A solid-state imaging device comprising:
a photoelectric conversion unit including a charge accumulation region in which a charge generated in accordance with incident light is accumulated; and
a transfer unit configured to transfer a charge accumulated in the charge accumulation region from the charge accumulation region,
wherein a potential distribution having a plurality of steps is formed in the charge accumulation region, and the further away from the transfer unit a step of the plurality of steps is, the greater the magnitude of the step is.

2. The device according to claim 1,
wherein the charge accumulation region is divided into a plurality of partial regions corresponding to a plurality of portions of the potential distribution that are divided by the plurality of steps, and
the further away from the transfer unit a partial region of the plurality of partial regions is, the larger the area of the partial region is.

3. The device according to claim 1,
wherein the transfer unit includes a channel region that is covered by a transfer electrode, and
in at least one of a plurality of partial regions of the charge accumulation region corresponding to a plurality of portions of the potential distribution that are divided by the plurality of steps, a width of the at least one partial region in a width direction of the channel region decreases as a distance from the transfer unit increases.

4. The device according to claim 1,
wherein the photoelectric conversion unit further includes a semiconductor region on the charge accumulation region, the semiconductor region having a conductivity type that is opposite to a conductivity type of the charge accumulation region, and
an impurity concentration distribution of the semiconductor region has a plurality of steps, and the further away from the transfer unit a step of the plurality of steps of the impurity concentration distribution is, the greater the magnitude of the step is, such that the potential distribution is formed in the charge accumulation region.

5. The device according to claim 1,
wherein an impurity concentration distribution of the charge accumulation region has a plurality of steps, and
the further away from the transfer unit a step of the plurality of steps of the impurity concentration distribution is, the greater the magnitude of the step is, such that the potential distribution is formed in the charge accumulation region.

6. The device according to claim 1,
wherein the potential distribution of the charge accumulation region has a flat portion.

7. The device according to claim 1, further comprising:
a signal conversion unit configured to convert a charge to an electric signal,
wherein the transfer unit transfers the charge accumulated in the charge accumulation region to the signal conversion unit.

8. A camera comprising:
the solid-state imaging device according to claim 1; and
a signal processing unit configured to process a signal obtained by the solid-state imaging device.

* * * * *